US011320573B2

(12) United States Patent
Sakai et al.

(10) Patent No.: US 11,320,573 B2
(45) Date of Patent: May 3, 2022

(54) DISPLAY DEVICE, METHOD FOR PRODUCING DISPLAY DEVICE, AND APPARATUS FOR PRODUCING DISPLAY DEVICE

(71) Applicant: SHARP KABUSHIKI KAISHA, Sakai (JP)

(72) Inventors: Akira Sakai, Sakai (JP); Masahiro Hasegawa, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 55 days.

(21) Appl. No.: 16/979,674

(22) PCT Filed: Mar. 15, 2018

(86) PCT No.: PCT/JP2018/010299
§ 371 (c)(1),
(2) Date: Sep. 10, 2020

(87) PCT Pub. No.: WO2019/176065
PCT Pub. Date: Sep. 19, 2019

(65) Prior Publication Data
US 2021/0048568 A1 Feb. 18, 2021

(51) Int. Cl.
*G02B 5/30* (2006.01)
*G02F 1/1337* (2006.01)
(Continued)

(52) U.S. Cl.
CPC ...... *G02B 5/3016* (2013.01); *G02F 1/133711* (2013.01); *H01L 27/1292* (2013.01); *G02F 1/133726* (2021.01); *H01L 51/5293* (2013.01)

(58) Field of Classification Search
CPC ............. G02B 5/3016; G02F 1/133711; G02F 1/133726; H01L 27/1292; H01L 51/5293
(Continued)

(56) References Cited

U.S. PATENT DOCUMENTS

| 2017/0123124 A1 | 5/2017 | Hatanaka et al. |
| 2018/0017828 A1* | 1/2018 | Wang ................ G02F 1/133528 |
| 2019/0094433 A1 | 3/2019 | Hatanaka et al. |

FOREIGN PATENT DOCUMENTS

JP 2017-083843 A 5/2017

* cited by examiner

*Primary Examiner* — Charles S Chang
(74) *Attorney, Agent, or Firm* — ScienBiziP, P.C.

(57) ABSTRACT

In order to make a step of forming an coated-type polarizer easier, provided is a display device including, from a lower layer, a TFT layer, a light-emitting layer, a sealing layer, and a polarization layer in this order, in which the polarization layer includes a polymerizable liquid crystal layer containing a polymerizable liquid crystal into which a dichroic pigment is mixed and an alignment film coming in contact with a portion of the polymerizable liquid crystal layer to align the polymerizable liquid crystal contained in the polymerizable liquid crystal layer with which the alignment film is in contact, and in a display region, a region in which the polymerizable liquid crystal layer and the alignment film of the polarization layer come into contact with each other is a polarization portion, and in a frame region surrounding the display region, a region in which the polymerizable liquid crystal layer and the alignment film of the polarization layer do not come in contact with each other is a black frame portion.

12 Claims, 8 Drawing Sheets

(51) Int. Cl.
*H01L 27/12* (2006.01)
*H01L 51/52* (2006.01)
(58) Field of Classification Search
USPC .................................... 349/96–103, 110–111
See application file for complete search history.

DISPLAY DEVICE, METHOD FOR PRODUCING DISPLAY DEVICE, AND APPARATUS FOR PRODUCING DISPLAY DEVICE

TECHNICAL FIELD

The disclosure relates to a display device with a light-emitting element.

BACKGROUND ART

PTL 1 discloses a coated-type polarizer containing a polymerizable liquid crystal and a dichroic pigment.

CITATION LIST

Patent Literature

PTL 1: JP 2017-83843 A (published on May 18, 2017)

SUMMARY

Technical Problem

In the manufacturing process of a display device, decorative printing may be performed on a frame portion of a cover material of the display device in black ink for the purpose of concealing the internal structure of a module or improving the design. In such a case, due to a thickness of the black ink, it may be difficult to form the aforementioned coated-type polarizer directly on cover glass.

Solution to Problem

To solve the above-described problem, a display device according to the present application is a display device including, from a lower layer, a TFT layer, a light-emitting layer, a sealing layer, and a polarization layer in this order, in which the polarization layer includes a polymerizable liquid crystal layer containing a polymerizable liquid crystal into which a dichroic pigment is mixed, and an alignment film coming in contact with a portion of the polymerizable liquid crystal layer configured to align the polymerizable liquid crystal contained in the polymerizable liquid crystal layer with which the alignment film is in contact, and in a display region, a region in which the polymerizable liquid crystal layer and the alignment film of the polarization layer come into contact with each other is a polarization portion, and in a frame region surrounding the display region, a region in which the polymerizable liquid crystal layer and the alignment film of the polarization layer do not come in contact with each other is a black frame portion.

In addition, to solve the above-described problem, a method for manufacturing a display device according to the present application includes a film formation step of forming each layer of the display device including, from a lower layer, a TFT layer, a light-emitting layer, a sealing layer, and a polarization layer in this order, in which the film formation step includes a polarization layer formation step of forming the polarization layer by forming a polymerizable liquid crystal layer containing a polymerizable liquid crystal into which a dichroic pigment is mixed and an alignment film coming in contact with a portion of the polymerizable liquid crystal layer configured to align the polymerizable liquid crystal contained in the polymerizable liquid crystal layer with which the alignment film is in contact, and in the polarization layer formation step, a polarization portion in which the polymerizable liquid crystal layer and the alignment film of the polarization layer come into contact with each other in a display region and a black frame portion in which the polymerizable liquid crystal layer and the alignment film of the polarization layer do not come in contact with each other in a frame region surrounding the display region are formed in the polymerization layer.

In addition, to solve the above-described problem, an apparatus for manufacturing a display device according to the present application includes a film formation device configured to form each layer of the display device including, from a lower layer, a TFT layer, a light-emitting layer, a sealing layer, and a polarization layer in this order, in which the film formation device produces the polarization layer by forming a polymerizable liquid crystal layer containing a polymerizable liquid crystal into which a dichroic pigment is mixed and an alignment film coming in contact with a portion of the polymerizable liquid crystal layer configured to align the polymerizable liquid crystal contained in the polymerizable liquid crystal layer with which the alignment film is in contact, and forms, in the polarization layer, a polarization portion in which the polymerizable liquid crystal layer and the alignment film of the polarization layer come into contact with each other in a display region and a black frame portion in which the polymerizable liquid crystal layer and the alignment film of the polarization layer do not come in contact with each other in a frame region surrounding the display region.

Advantageous Effects of Disclosure

According to the configuration described above, it is possible to provide a method for manufacturing a display device, which makes a step of forming a coated-type polarizer easier.

DESCRIPTION OF EMBODIMENTS

First Embodiment

In the following, a "same layer" means a layer formed of an identical material in an identical process. In addition, a "lower layer" means a layer formed in a process before the layer being compared, and an "upper layer" means a layer formed in a process after the layer being compared. Also, in the present specification, the direction from a lower layer toward an upper layer of a display device is defined as upward.

Figure 1:
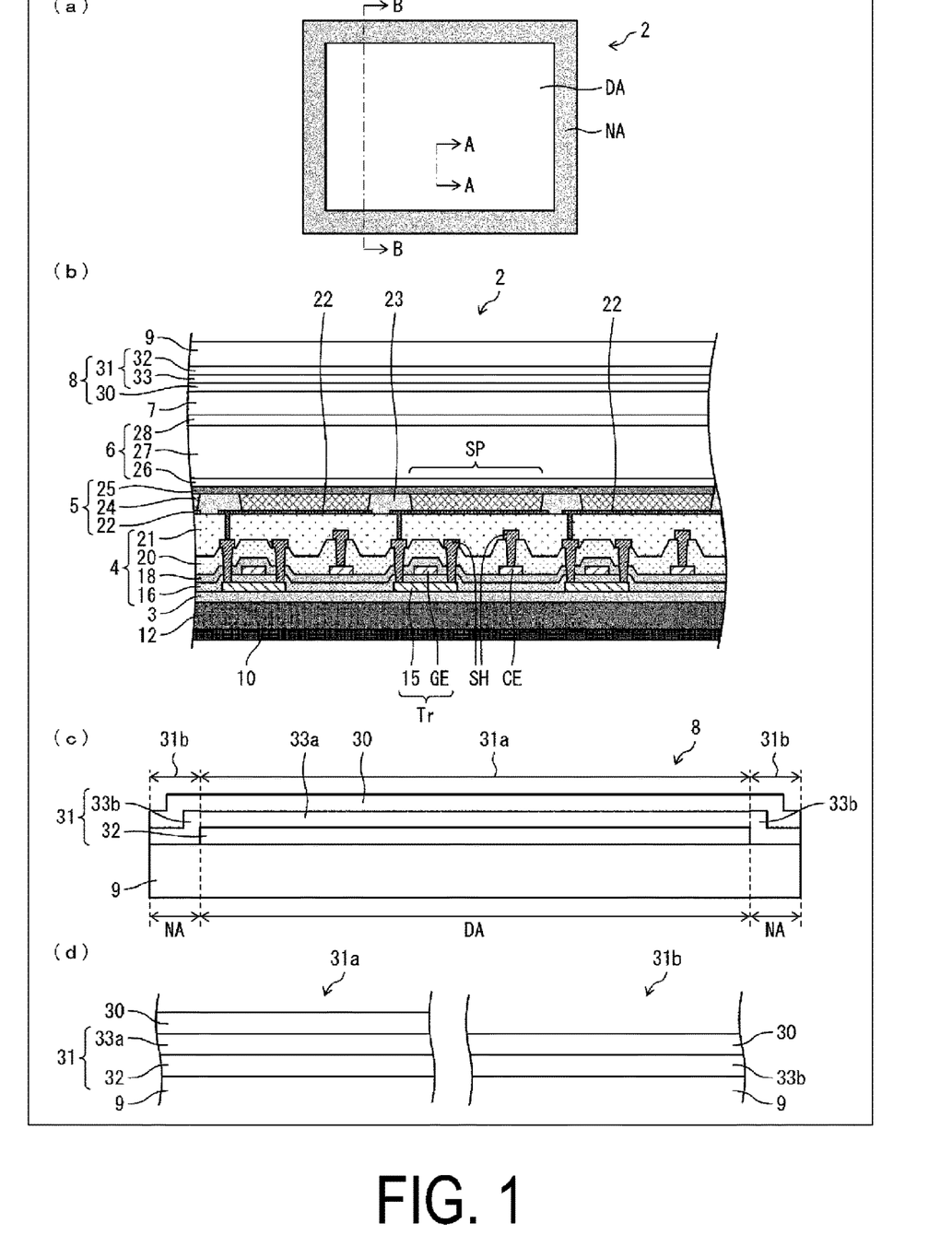
FIG. 1 is a schematic view illustrating a display device and a circular polarization layer according to a first embodiment.

FIG. 1 is a schematic view illustrating a display device and a circular polarization layer according to a first embodiment. (a) of FIG. 1 is a top view of a display device 2 according to the present embodiment. (b) of FIG. 1 is a cross-sectional view taken along line A-A in (a) of FIG. 1. (c) of FIG. 1 is a cross-sectional view taken along line B-B in (a) of FIG. 1, which is obtained by enlarging peripheries of a circular polarization layer 8 of the display device 2. (d) of FIG. 1 is a cross-sectional view illustrating details of a configuration of a polarization portion 31a and a black frame portion 31b in the circular polarization layer 8. Note that, in (c) and (d) of FIG. 1, a cover material 9 is illustrated as being underneath, unlike in (b) of FIG. 1, in order to achieve consistency with the view illustrated in FIG. 4.

As illustrated in (a) of FIG. 1, the display device 2 according to the present embodiment includes a display region DA and a frame region NA around the display region DA. The display device 2 according to the present embodiment will be described in detail with reference to (b) of FIG. 1.

As illustrated in (b) of FIG. 1, the display device 2 according to the present embodiment includes a support substrate 10, a resin layer 12, a barrier layer 3, a TFT layer 4, a light-emitting element layer 5, a sealing layer 6, a function film 7, a circular polarization layer 8, and a cover material 9 in this order from the lower layer.

The support substrate 10 may be a glass substrate, for example. A material of the resin layer 12 includes, for example, a polyimide.

The barrier layer 3 is a layer for preventing foreign matter such as water and oxygen from penetrating into the TFT layer 4 and the light-emitting element layer 5 during usage of the display device. The barrier layer 3 may be configured by a silicon oxide film, a silicon nitride film, or a silicon oxynitride film, or a layered film thereof, formed using CVD, for example.

The TFT layer 4 includes a semiconductor layer 15, a first inorganic layer 16 (gate insulating film), a gate electrode GE (first wiring line), a second inorganic layer 18, a capacitance electrode CE, a third inorganic layer 20, a source wiring line SH (second wiring line), and a flattening film 21 (interlayer insulating film) in this order from the lower layer. A thin film transistor (TFT) Tr is configured to include the semiconductor layer 15, the first inorganic layer 16, and the gate electrode GE.

The semiconductor layer 15 is formed of low-temperature polysilicon (LTPS) or an oxide semiconductor, for example. Note that, although the TFT provided with the semiconductor layer 15 for forming a channel is illustrated as having a top gate structure in (b) of FIG. 1, the TFT may have a bottom gate structure (e.g., in a case where the channel of the TFT is formed in an oxide semiconductor).

The gate electrode GE, the capacitance electrode CE, and the source wiring line SH may include, for example, at least one of aluminum (Al), tungsten (W), molybdenum (Mo), tantalum (Ta), chromium (Cr), titanium (Ti), and copper (Cu). Furthermore, the gate electrode GE, the capacitance electrode CE, or the source wiring line SH is constituted by a single-layer film or a layered film of any of the metals described above.

The first inorganic layer 16, the second inorganic layer 18, and the third inorganic layer 20 can be configured by a silicon oxide (SiOx) film or a silicon nitride (SiNx) film, or a layered film thereof, formed using CVD, for example. The flattening film 21 can be formed of, for example, a coatable photosensitive organic material such as a polyimide or acryl.

The light-emitting element layer 5 (e.g., an organic light-emitting diode layer) includes a pixel electrode 22 (first electrode, e.g., an anode), a cover film 23 that covers an edge of the pixel electrode 22, a light-emitting layer 24, and an upper electrode (second electrode, e.g., a cathode) 25 in this order from the lower layer. The light-emitting element layer 5 is provided with, for each subpixel SP, a light-emitting element (e.g., an organic light-emitting diode (OLED)) including the island-shaped pixel electrode 22, the island-shaped light-emitting layer 24, and the upper electrode 25, and a subpixel circuit configured to drive the light-emitting element.

The cover film 23 is an organic insulating film and is formed by applying a photosensitive organic material, for example, a polyimide or an acryl and then patterning the photosensitive organic material using photolithography. The cover film 23 includes an opening for each of the plurality of subpixels SP.

The light-emitting layer 24 is formed by, for example, layering a hole transport layer, a light-emitting layer, and an electron transport layer in this order from the lower layer side. The light-emitting layer is formed in an island shape for each subpixel SP by using a vapor deposition method or an ink-jet method. The hole transport layer and the electron transport layer may be formed in an island shape for each subpixel SP or formed in a solid-like shape as a common layer for the plurality of subpixels SP.

The pixel electrode 22 is formed in an island shape for each of the plurality of subpixels SP, formed by layering, for example, indium tin oxide (ITO) and an alloy containing Ag, and has light reflectivity. The upper electrode 25 is formed in a solid shape as a common layer for the plurality of subpixels SP and can be formed of a light-transmitting conductive material such as indium tin oxide (ITO) or indium zinc oxide (IZO).

When the light-emitting element layer 5 is an OLED layer, positive holes and electrons are recombined in the light-emitting layer 24 by a drive current flowing between the pixel electrode 22 and the upper electrode 25, excitons generated from the recombination then fall to a ground state, and thereby light is emitted. Since the upper electrode 25 has a light-transmitting property and the pixel electrode 22 is light-reflective, the light emitted from the light-emitting layer 24 travels upwards, resulting in top emission.

The sealing layer 6 includes an inorganic sealing film 26 as an upper layer of the upper electrode 25, an organic sealing film 27 as an upper layer of the inorganic sealing film 26, and an inorganic sealing film 28 as an upper layer of the organic sealing film 27, and prevents foreign matter such as water and oxygen from penetrating into the light-emitting element layer 5. The inorganic sealing films 26 and 28 can be formed of a silicon oxide film, a silicon nitride film, a silicon oxynitride film, or a layered film thereof, formed by CVD, for example. The organic sealing film 27 can be formed of a coatable photosensitive organic material such as a polyimide or an acryl.

The function film 7 may be a function film having a touch sensor function, a protection function, or the like.

The circular polarization layer 8 is formed as an upper layer of the function film 7, and includes a λ/4 plate 30 and a polarization layer 31. The λ/4 plate 30 is a retarder that delays a phase of a polarization component of light that is horizontal to a delay axis of the λ/4 plate 30 by λ/4 among polarization components of the light to be transmitted. The delay axis of the λ/4 plate 30 may be perpendicular or parallel to the longitudinal direction of the display region DA. The polarization layer 31 has a function of a linear polarizer that transmits only light having a polarization component that is horizontal to the polarization axis of the polarization layer 31, and absorbs only light having a polarization component that is horizontal to an absorption axis that is orthogonal to a transmission axis, among polarization components of the light to be transmitted. The polarization layer 31 is formed such that a direction of the polarization axis of the polarization layer 31 and the delay axis of the λ/4 plate 30 form an angle of 45°.

Due to a combination of the λ/4 plate 30 and the polarization layer 31, the circular polarization layer 8 has a function of a circular polarizer. Thus, it is possible to reduce reflection of external light incident from a display surface to the inside of the display device 2 on the upper electrode 25 and the like and re-emission of the light from the display surface.

A configuration of the polarization layer 31 will be described in more detail with reference to (c) and (d) of FIG. 1. As illustrated in (c) and (d) of FIG. 1, the polarization layer 31 is formed as an upper layer of the λ/4 plate 30. The polarization layer 31 includes an alignment film 32 and a polymerizable liquid crystal layer 33. In the present embodiment, the display device 2 includes the alignment film 32 between the polymerizable liquid crystal layer 33 and the cover material 9, which will be described later, as an upper layer of the polarization layer 31.

In the display region DA, an aligned polymerizable liquid crystal portion 33a that is in contact with the alignment film 32 is provided, and a polarization portion 31a is formed. On the other hand, in the frame region, the polymerizable liquid crystal layer 33 is not in contact with the alignment film 32 and includes a non-aligned polymerizable liquid crystal portion 33b formed directly as the upper layer of the λ/4 plate 30, and a black frame portion 31b is formed. Thus, the alignment film 32 comes in contact with a portion of the polymerizable liquid crystal layer 33.

Figure 2:
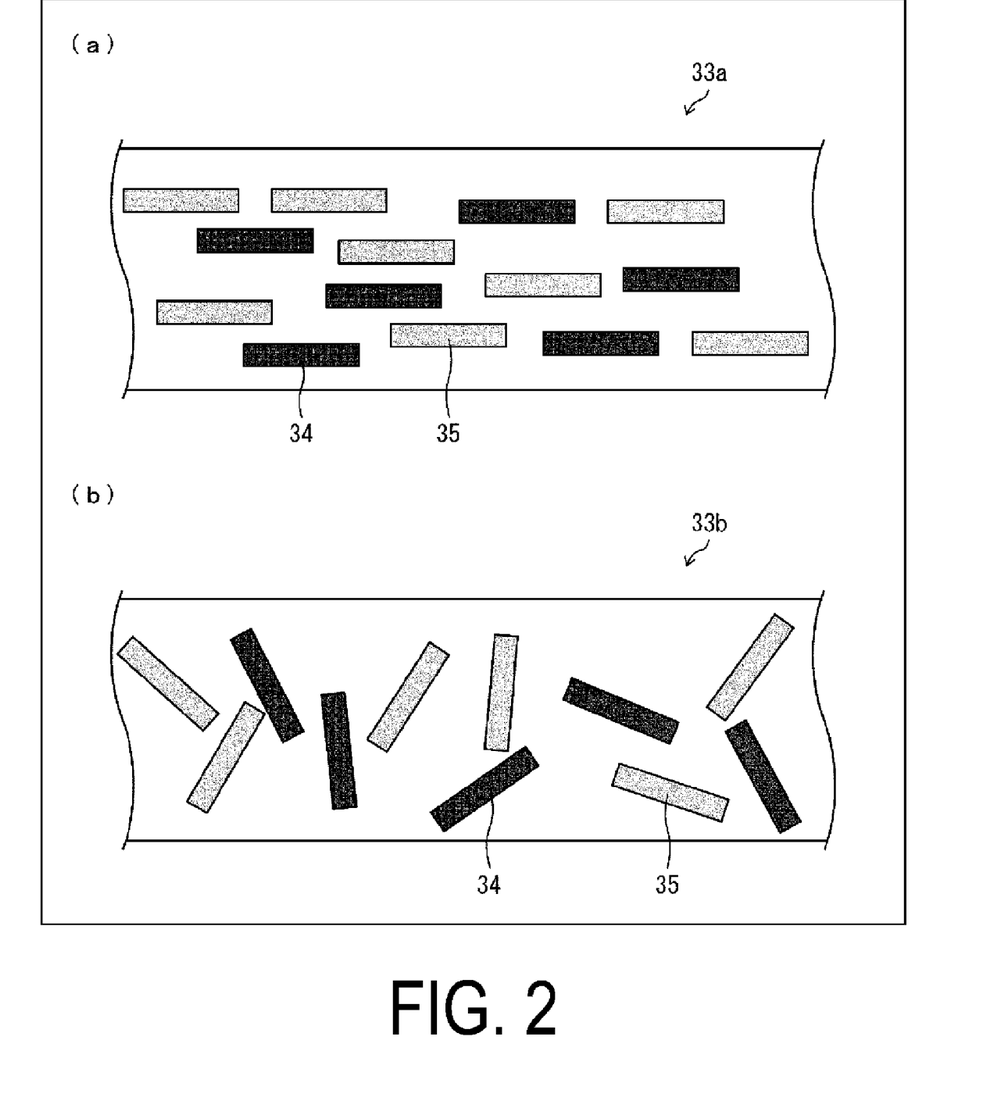
FIG. 2 is an enlarged cross-sectional view of a polymerizable liquid crystal layer according to the first embodiment.

(a) and (b) of FIG. 2 are enlarged cross-sectional views of the aligned polymerizable liquid crystal portion 33a and the non-aligned polymerizable liquid crystal portion 33b, respectively. The aligned polymerizable liquid crystal portion 33a and the non-aligned polymerizable liquid crystal portion 33b include a polymerizable liquid crystal 34 and a dichroic pigment 35. The polymerizable liquid crystal 34 includes a liquid crystal material uniformly aligned by performing a specific alignment treatment. The dichroic pigment 35 is a substantially rectangular light absorbing material in a longitudinal direction, and more strongly absorbs light having a polarization component parallel to the longitudinal direction of light incident on the dichroic pigment 35.

The aligned polymerizable liquid crystal portion 33a is in contact with the alignment film 32 that has been subjected to the alignment treatment which will be described below. Thus, as illustrated in (a) of FIG. 2, in the aligned polymerizable liquid crystal portion 33a, the polymerizable liquid crystal 34 is uniformly aligned, and accordingly the dichroic pigment 35 is uniformly aligned as well. Accordingly, the aligned polymerizable liquid crystal portion 33a absorbs light having a polarization component in a direction in which the polymerizable liquid crystal 34 is uniformly aligned. Thus, the polarization layer 31 including the aligned polymerizable liquid crystal portion 33a forms the polarization portion 31a having a polarization axis in a direction perpendicular to the direction in which the polymerizable liquid crystal 34 is uniformly aligned. Note that the alignment film 32 that does not function as a member for aligning the polymerizable liquid crystal 34 may be in contact with the polymerizable liquid crystal layer 33.

On the other hand, the non-aligned polymerizable liquid crystal portion 33b is not in contact with the alignment film 32 that has been subjected to the alignment treatment, which will be described below. Thus, as illustrated in (b) of FIG. 2, in the non-aligned polymerizable liquid crystal portion 33b, the polymerizable liquid crystal 34 is substantially randomly aligned, and thus the dichroic pigment 35 is substantially randomly aligned as well. Thus, the non-aligned polymerizable liquid crystal portion 33b absorbs all light regardless of polarization. Thus, the polarization layer 31 including the non-aligned polymerizable liquid crystal portion 33b forms the black frame portion 31b that does not transmit light. Note that the non-aligned polymerizable liquid crystal portion 33b also includes a portion of the polymerizable liquid crystal layer 33 that has not been subjected to the alignment treatment, does not contribute to the alignment of the polymerizable liquid crystal 34 in the polymerizable liquid crystal layer 33, and comes in contact with the region of the alignment film 32.

The cover material 9 has a function of protecting the display device 2, and may be obtained by, for example, bonding a window film to the upper layer of the circular polarization layer 8. Furthermore, the display device 2 may include a rigid member such as a cover glass instead of a flexible member such as a film or the like as the cover material 9.

Figure 3:
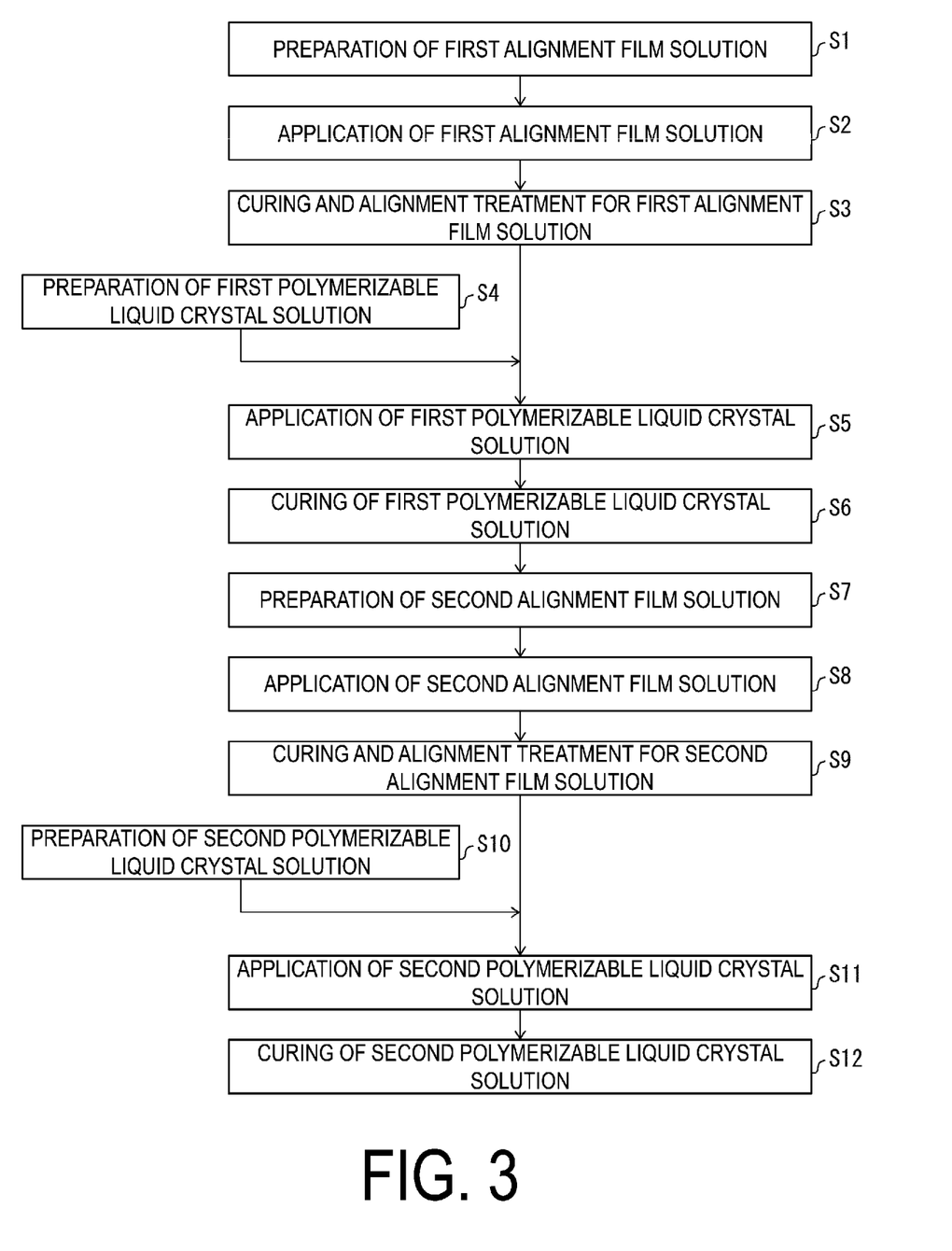
FIG. 3 is a flowchart for explaining a step of forming a circular polarization layer according to the first embodiment.
Figure 4:
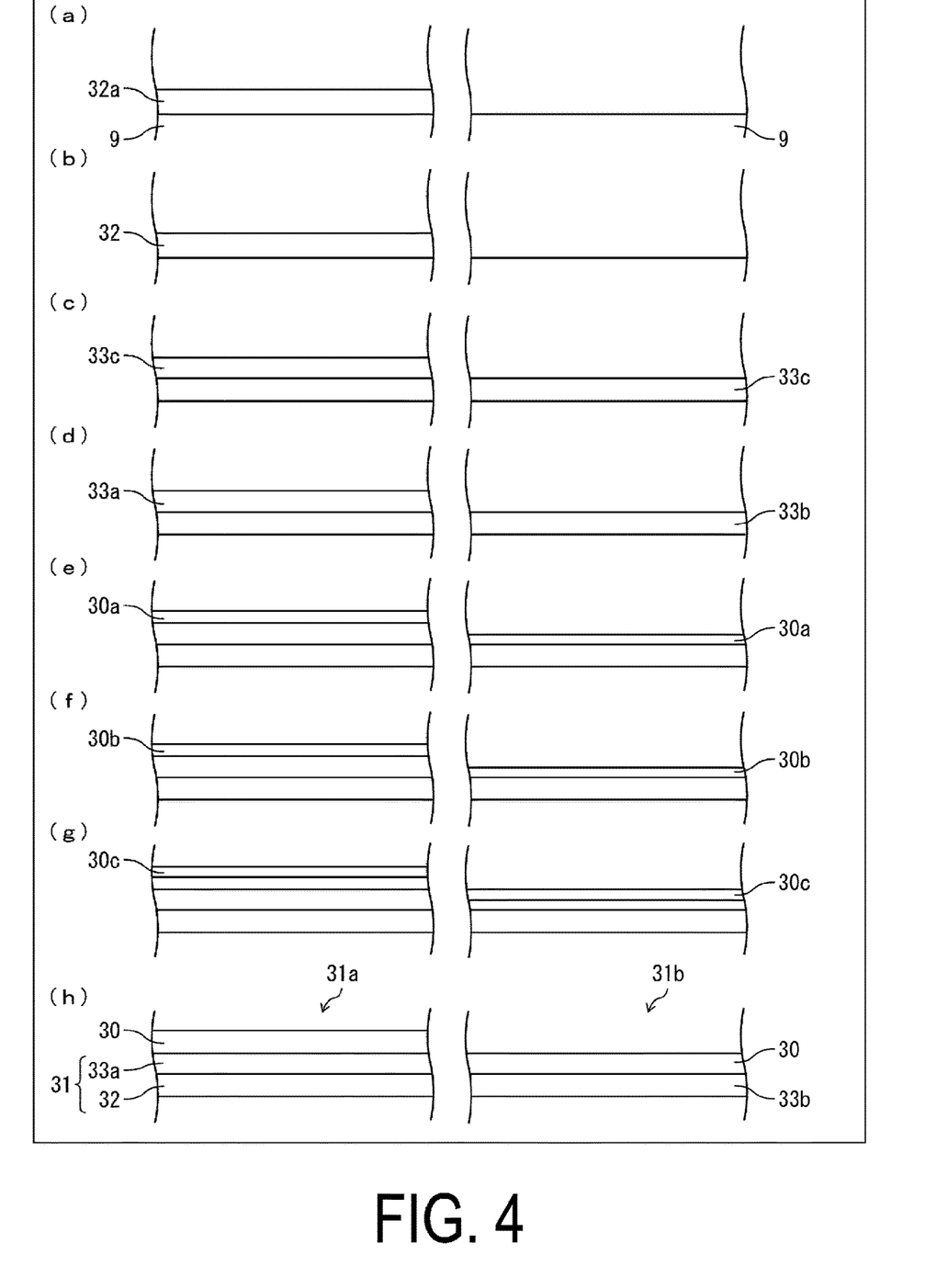
FIG. 4 is a cross-sectional process view for describing a step of forming the circular polarization layer according to the first embodiment.

FIG. 3 is a flowchart describing a step of forming the circular polarization layer 8. FIG. 4 is a cross-sectional process view illustrating a step of forming the circular polarization layer 8 in order from (a) to (h). The step of forming the circular polarization layer 8 according to the present embodiment will be described in detail with reference to FIGS. 3 and 4.

In the present embodiment, as illustrated in FIG. 4, a method of obtaining the circular polarization layer 8 by sequentially forming the polarization layer 31 and the λ/4 plate 30 on the cover material 9 will be described.

First, the cover material 9 is formed, and the polarization layer 31 is formed as the upper layer of the cover material 9. The polarization layer 31 is obtained by applying and curing a first polymerizable liquid crystal solution 33c on the upper layers of the cover material 9 and the alignment film 32 that have been subjected to the alignment treatment, which will be described below.

First, a first alignment film solution 32a is prepared (step S1). In the present embodiment, first, a mixed solvent containing methyl ethyl ketone (MEK) and methyl isobutyl ketone (MIBK) at a weight ratio of 10:1 is prepared. Next, a material is prepared by mixing 50 parts by weight of urethane (meth)acrylate oligomer, 50 parts by weight of pentaerythritol triacrylate (PETA), and 4 parts by weight of a photopolymerization initiator. For the urethane (meth)acrylate oligomer, "UV1700B" (manufactured by Nippon Synthetic Chemical Industry Co., Ltd.) is employed. In addition, for the pentaerythritol triacrylate, "light acrylate PE-3A" (manufactured by Kyoeisha Chemical Co., Ltd.) is employed. Additionally, for the photopolymerization initiator, "Lucirin TPO" (manufactured by BASF) is employed. Next, the above mixed material is then added to the above mixed solvent such that the solid content concentration is 20%, and thereby the first alignment film solution 32a is obtained.

Next, as illustrated in (a) of FIG. 4, the prepared first alignment film solution 32a is applied to the upper layer of the cover material 9 using a flexographic printing method or the like (step S2). At this time, as illustrated in (a) of FIG. 4, the first alignment film solution 32a is applied to the display region DA only using separate painting, patterning, or the like. In other words, the first alignment film solution 32a is not applied to the frame region NA. The application of the first alignment film solution 32a may be performed using an ink-jet method.

Next, the applied first alignment film solution 32a is dried for 1 minute in an oven at 80° C., cured by irradiation with ultraviolet light, and rubbed in the direction of 0° to be subjected to the alignment treatment (step S3). As a result, the alignment film 32 illustrated in (b) of FIG. 4 is obtained. Note that the direction of 0° in which the alignment film 32 is rubbed can be parallel to the longitudinal direction of the display region DA. Note that in step S2, after the first alignment film solution 32a may also be applied to the frame region NA, the first alignment film solution 32a in the frame region NA may be removed, and thereby the alignment film 32 may be obtained.

At this point, the first polymerizable liquid crystal solution 33c has been prepared (step S4). The first polymerizable liquid crystal solution 33c may be obtained by mixing 100 parts by weight of a polymerizable liquid crystal solution "RMS03-013" (manufactured by Merck) and 2 parts by weight of a dichroic pigment "NKX2029" (manufactured by Hayashihara Biochemistry Laboratories). In particular, it is preferable that the amount of the dichroic pigment 35 added to the polymerizable liquid crystal 34 in the polarization portion 31a is 1 to 2 mass % because the polarization portion 31a can be appropriately configured.

Next, as illustrated in (c) of FIG. 4, the prepared first polymerizable liquid crystal solution 33c is applied to the upper layers of the alignment film 32 and the cover material 9 using a slit coating method or the like (step S5). Next, the applied first polymerizable liquid crystal solution 33c is dried for 1 minute in an oven at 120° C., and the mixture is irradiated with ultraviolet light using a high-pressure mercury lamp with an irradiation dose of 400 mJ/cm$^2$ and cured (step S6). In step S6, the polymerizable liquid crystal in the first polymerizable liquid crystal solution 33c in contact with the alignment film 32 is uniformly aligned by curing in a direction in which the alignment film 32 has been rubbed. In addition, in step S6, the first polymerizable liquid crystal solution 33c not coming in contact with the alignment film 32 is cured while the polymerizable liquid crystal in the first polymerizable liquid crystal solution 33c remains in substantially random alignment. As a result, the polymerizable liquid crystal layer 33 including the aligned polymerizable liquid crystal portion 33a and the non-aligned polymerizable liquid crystal portion 33b illustrated in (d) of FIG. 4 is obtained, and the step of forming the polarization layer 31 is completed.

Next, the λ/4 plate 30 is formed as the upper layer of the resulting polarization layer 31. The λ/4 plate 30 is obtained by applying and curing a second polymerizable liquid crystal solution 30c on the upper layer of a J4 plate alignment film 30b which has been subjected to the alignment treatment described below.

First, the second alignment film solution 30a is prepared (step S7). Although not limited thereto, in the present embodiment, the second alignment film solution 30a may be identical to the first alignment film solution 32a. If an identical solution to the first alignment film solution 32a is used as the second alignment film solution 30a, the step S7 may be omitted.

Next, the prepared second alignment film solution 30a is applied to the upper layers of the aligned polymerizable liquid crystal portion 33a and the non-aligned polymerizable liquid crystal portion 33b (step S8). At this time, the second alignment film solution 30a may be applied to the region including the frame region NA and the display region DA. Except that the second alignment film solution 30a is also applied to the display region DA, step S8 may be performed in the same manner as step S2.

Next, the applied second alignment film solution 30a is dried for 1 minute in an oven at 80° C., cured by irradiation with ultraviolet light, and rubbed in a direction of 45° to be subjected to the alignment treatment (step S9). As a result, the λ/4 plate alignment film 30b illustrated in (f) of FIG. 4 is obtained.

At this point, the second polymerizable liquid crystal solution 30c has been prepared (step S10). In the present embodiment, first, a solvent containing cyclopentanone and N-methyl-2-pyrrolidone (NMP) at a weight ratio of 6:4 is prepared. Next, a material is prepared by mixing 12.31 parts by weight of polymerizable liquid crystal of Chemical Formula (1) below, 0.86 parts by weight of polymerizable liquid crystal of Chemical Formula (2) below, 0.73 parts by weight of a polymerization initiator, and 0.01 parts by weight of a leveling agent. For the polymerization initiator, "irgacurc369" (manufactured by BASF) is employed. Furthermore, for the leveling agent, "BYK-361 N" (manufactured by BYK-Chemie) is employed. Next, the above-described mixed material is then mixed with the solvent described above to have a concentration of

[Chemical Formula 1]

(1)

[Chemical Formula 2]

(2)

Next, as illustrated in (g) of FIG. 4, the prepared second polymerizable liquid crystal solution 30c is applied to the upper layer of the λ/4 plate alignment film 30b using a slit coating method or the like (step S11). Next, the applied second polymerizable liquid crystal solution 30c is dried for 1 minute in an oven at 120° C., and the mixture is irradiated with ultraviolet light using a high-pressure mercury lamp with an irradiation dose of 400 mJ/cm² and cured (step S12). As a result, the λ/4 plate 30 illustrated in (h) of FIG. 4 is obtained, and the step of forming the circular polarization layer 8 is completed.

Thereafter, the display device 2 according to the present embodiment may be obtained by forming a layered body formed by layering the support substrate 10 onto the function film 7 in (b) of FIG. 1, and bonding the upper surface of the function film 7 to the λ/4 plate 30 of the obtained circular polarization layer 8. As described above, in a case where the circular polarization layer 8 and the layered body are formed separately, the display device 2 can be easily configured at low cost by forming the circular polarization layer 8 directly on the layered body.

Note that, although the alignment treatment is performed by rubbing in the production step described above, the alignment treatment may be performed by irradiating the alignment film having a photoreactive group with polarized ultraviolet light. In particular, from the viewpoint of forming the alignment film 32 in an unpolarized state in the black frame portion 31b, alignment treatment using ultraviolet radiation is more preferable.

The display device 2 according to the present embodiment includes, in the polarization layer 31, the polymerizable liquid crystal layer 33 including the aligned polymerizable liquid crystal portion 33a forming the polarization portion 31a and the non-aligned polymerizable liquid crystal portion 33b forming the black frame portion 31b. Furthermore, the polarization layer 31 includes the polarization portion 31a in the display region DA and the black frame portion 31b in the frame region NA. Thus, the frame region NA can be concealed by the black frame portion 31b.

Thus, since the polarization layer 31 has a function of concealing the frame region NA, it is not necessary to print black ink on the cover material 9 separately to conceal the frame region NA. Furthermore, with no need to form an coated-type polarizer on a top surface of glass or the like on which a black ink is printed, the polarization layer can be formed by forming the polarization layer 31 on the flat top surface of the cover material 9 or the like on which a black ink is not printed. Thus, the display device 2 according to the present embodiment can make the step of forming the coated-type polarization layer easier.

In addition, in a method for manufacturing the display device 2, the alignment film 32 can be formed using a printing method or an ink-jet method, and the polymerizable liquid crystal layer 33 can be formed using a coating method. As a result, the polarization layer 31 can be formed by coating, which contributes to making the display device 2 thinner compared with a method of bonding a polarization film or the like.

Note that, although a width of the black frame portion 31b depends on a size of the frame region NA, or the like, it may be not less than 3 mm and not greater than 15 mm.

Figure 5:
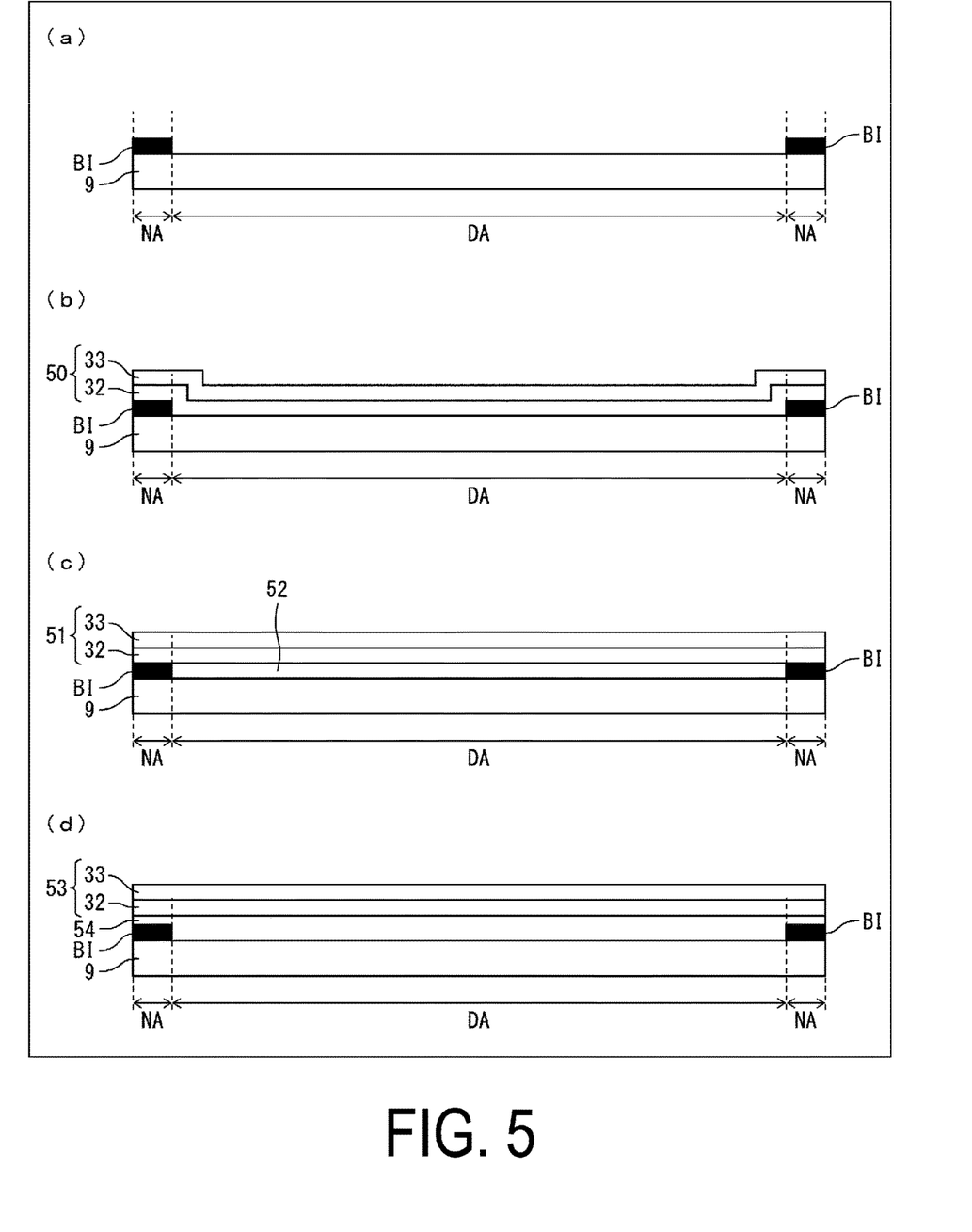
FIG. 5 is a schematic view illustrating a black ink and a polarization layer of a frame region according to a comparative embodiment.

FIG. 5 is a diagram for describing a method for manufacturing a polarization layer and a problem according to a comparative embodiment. In the comparative embodiment, decorative printing of a black ink BI or the like on a cover material 9 may be performed as illustrated in (a) of FIG. 5 in order to conceal a frame region NA, or the like. In this case, the polarization layer 50 according to the comparative embodiment is obtained by applying a polymerizable liquid crystal layer 33 and an alignment film 32 on a surface of the cover material 9 on which the black ink BI is formed, as illustrated in (b) of FIG. 5. However, since the surface on which the polymerizable liquid crystal layer 33 and the alignment film 32 are formed has unevenness of approximately tens to hundreds of μm due to the black ink BI, it is difficult to form the polarization layer 50.

Here, in order to reduce the unevenness of the surface on which the polymerizable liquid crystal layer 33 and the alignment film 32 are formed due to the black ink BI, a method of printing a transparent ink 52 between black inks BI, as in the polarization layer 51 according to the comparative embodiment illustrated in (c) of FIG. 5, is conceivable. As a method for solving the same problem, it is also conceivable to transfer the polymerizable liquid crystal layer 33 and the alignment film 32 formed on another substrate, for example, the polarization layer 53 according to the comparative embodiment illustrated in (d) of FIG. 5, using a thick adhesive layer 54. However, in the polarization layers 51 and 53, there is a problem in that the film thickness increases and the number of steps in each of the formation steps increases.

Figure 6:
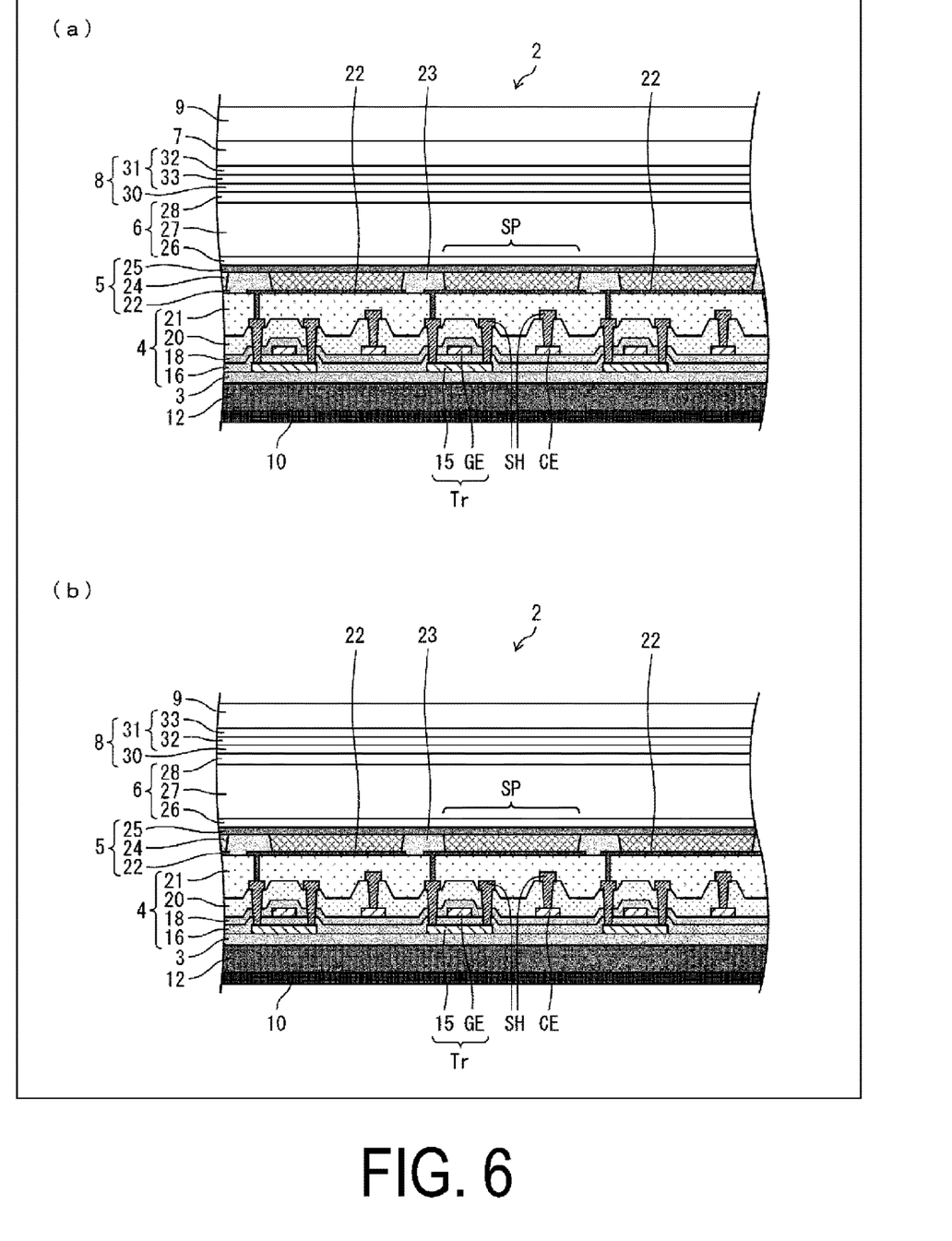
FIG. 6 is a schematic cross-sectional view of a display device according to a second embodiment.

Second Embodiment (a) of FIG. 6 is a cross-sectional view of a display device 2 according to the present embodiment. The display device 2 according to the present embodiment differs in configuration from the display device 2 according to the previous embodiment only in that a function film 7 is provided between a circular polarization layer 8 and a cover material 9. Compared with the display device 2 according to the previous embodiment, the display device 2 according to the present embodiment may be obtained using the same manufacturing method except that the circular polarization layer 8 is formed directly as the upper layer of a sealing layer 6 and the cover material 9 is formed directly as the upper layer of the circular polarization layer 8.

The display device 2 according to the present embodiment includes the function film 7 on an upper layer close to the display surface than the circular polarization layer 8. For this reason, in order to set the function film 7 as an in-cell film, it is not necessary to employ a COP polymer-based film or the like using a substrate with low birefringence as the function film 7. As a result, this leads to a reduction in cost for the display device 2.

In addition, when a display device without a function of a touch panel or the like is to be configured, the function film 7 may be removed as in a display device 2 according to the modified example illustrated in (b) of FIG. 6. In this case, the configuration contributes to thinning of the display device 2. Furthermore, as illustrated in (b) of FIG. 6, an alignment film 32 may be provided between the sealing layer 6 and a polymerizable liquid crystal layer 33. In order to obtain the display device 2 illustrated in (b) of FIG. 6, a λ/4 plate 30, the alignment film 32, and the polymerizable liquid crystal layer 33 may be formed directly on a top surface of the sealing layer 6 in this order.

Figure 7:
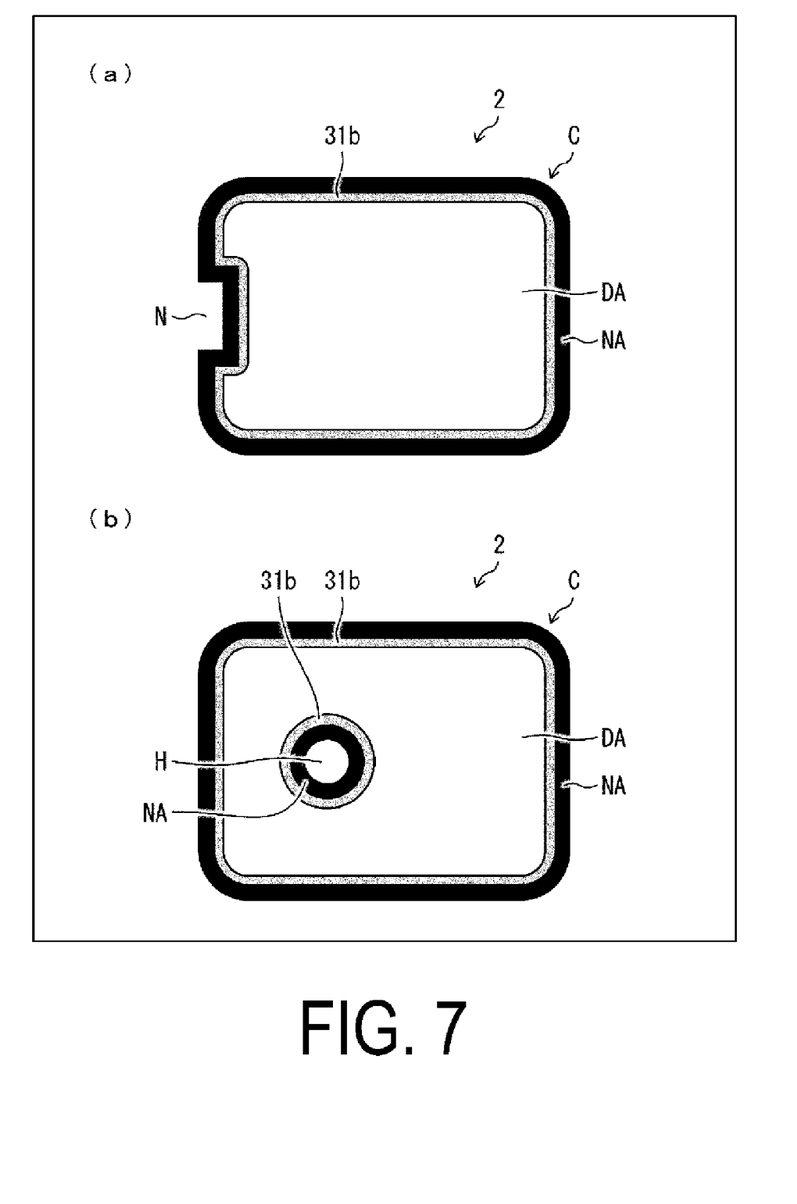
FIG. 7 is a schematic top view of a display device according to a third embodiment.

Third Embodiment (a) and (b) of FIG. 7 are top views of a display device 2 according to the present embodiment. The display device 2 in each of (a) and (b) of FIG. 7 includes the black frame portion 31*b* described above in the frame region NA.

As illustrated in (a) and (b) of FIG. 7, the display device 2 according to the present embodiment does not have a rectangular shape but has quadrant corner portions C at four corners. Thus, also in the display region DA and the frame region NA, the quadrant corner portions are formed at the four corners. In the present embodiment, the corner portions C may have the black frame portion 31*b*. The black frame portion 31*b* at the corner portions C may be obtained by patterning the four corners of the alignment film 32 along the outer shape of the corner portions C. In the present embodiment, the display device 2 having a deformed panel that is not a rectangular shape can be provided.

Further, the display device 2 illustrated in (a) of FIG. 7 includes a notch portion N at an end portion. Similarly, the display device 2 illustrated in (b) of FIG. 7 includes an opening H at a position surrounded by the display region DA. The notch portion N and the opening H may be formed together when a plurality of display devices 2 formed on a mother substrate are singulated into separate display devices 2. An external mounting device or the like may be mounted to the notch portion N and the opening H.

Here, in the present embodiment, the black frame portion 31*b* is formed in the frame region NA around the notch portion N illustrated in (a) of FIG. 7. Furthermore, in the present embodiment, the black frame portion 31*b* is formed in the frame region NA around the opening H illustrated in (b) of FIG. 7. In the present embodiment, the black frame portion 31*b* described above makes it possible to conceal peripheries of the notch portion N and the opening H, and the like.

The black frame portion 31*b* around the notch portion N and the opening H may be obtained by irradiating alignment materials at the end portions of the notch portion N and the opening H on the display region DA side with a laser to form the alignment film 32. Thus, the alignment film 32 can be formed along the complex outer shapes of the notch portion N and the opening H, and as a result the black frame portion 31*b* can be formed.

Figure 8:
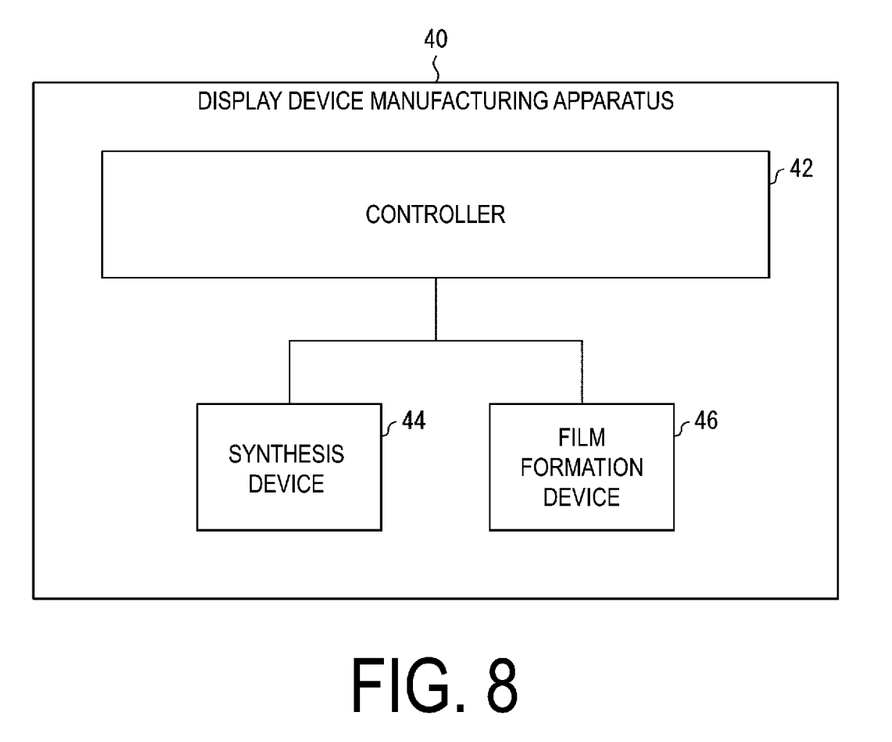
FIG. 8 is a block diagram illustrating a manufacturing apparatus of a display device according to each embodiment.

FIG. 8 is a block diagram illustrating a display device manufacturing apparatus 40 according to each embodiment described above. The manufacturing apparatus 40 of a display device includes a controller 42, a synthesis device 44, and a film formation device 46. The controller 42 controls the synthesis device 44 and the film formation device 46. The synthesis device 44 prepares the first alignment film solution 32*a*, the second alignment film solution 32*a*, the first polymerizable liquid crystal solution 30*c*, and the second polymerizable liquid crystal solution 33*c*. The film formation device 46 performs film formation of each layer of the display devices according to the embodiments described above.

Supplement

A display device according to a first aspect is a display device including, from a lower layer, a TFT layer, a light-emitting layer, a sealing layer, and a polarization layer in this order, in which the polarization layer includes a polymerizable liquid crystal layer containing a polymerizable liquid crystal into which a dichroic pigment is mixed, and an alignment film coming in contact with a portion of the polymerizable liquid crystal layer to align the polymerizable liquid crystal contained in the polymerizable liquid crystal layer with which the alignment film is in contact, and in a display region, a region in which the polymerizable liquid crystal layer and the alignment film of the polarization layer come into contact with each other is a polarization portion, and in a frame region surrounding the display region, a region in which the polymerizable liquid crystal layer and the alignment film of the polarization layer do not come in contact with each other is a black frame portion.

In a second aspect, the cover material is further provided as an upper layer of the polarization layer, and the polarization layer includes the alignment film between the polymerizable liquid crystal layer and the cover material.

In a third aspect, the polarization layer includes the alignment film between the sealing layer and the polymerizable liquid crystal layer.

In a fourth aspect, the λ/4 plate is provided between the sealing layer and the polarization layer.

In a fifth aspect, a function film is provided as an upper layer or a lower layer of the polarization layer.

In a sixth aspect, a width of the black frame portion is not less than 3 mm and not greater than 15 mm.

In a seventh aspect, at least one of a notch portion with the black frame portion provided therearound on the display region side and an opening positioned to be surrounded by the display region with the black frame portion provided therearound on the frame region side is provided at an end portion.

A method for manufacturing a display device according to an eighth aspect includes a film formation step of forming each layer of the display device including, from a lower layer, a TFT layer, a light-emitting layer, a sealing layer, and a polarization layer in this order, in which the film formation step includes polarization layer formation step of forming the polarization layer by forming a polymerizable liquid crystal layer containing a polymerizable liquid crystal into which a dichroic pigment is mixed and an alignment film coming in contact with a portion of the polymerizable liquid crystal layer to align the polymerizable liquid crystal contained in the polymerizable liquid crystal layer with which the alignment film is in contact, and in the polarization layer formation step, a polarization portion in which the polymerizable liquid crystal layer and the alignment film of the polarization layer come into contact with each other in a display region and a black frame portion in which the polymerizable liquid crystal layer and the alignment film of the polarization layer do not come in contact with each other in a frame region surrounding the display region are formed in the polarization layer.

In a ninth aspect, in the polarization layer formation step, the alignment film is formed in a printing method or an ink-jet method.

In a tenth aspect, in the polarization layer formation step, the polarization layer is formed using a coating method.

In an eleventh aspect, the film formation step includes a notch/opening formation step of forming, at an end portion, at least one of a notch portion with the black frame portion provided therearound on the display region side and an opening positioned to be surrounded by the display region with the black frame portion provided therearound on the frame region side and a laser radiation step of irradiating an alignment material at an end portion of at least one of the notch portion and the opening on the display region side with a laser to form the alignment film.

A display device manufacturing apparatus according to a twelfth aspect includes a film formation device that forms each layer of the display device including, from a lower layer, a TFT layer, a light-emitting layer, a sealing layer, and a polarization layer in this order, in which the film formation device forms the polarization layer by forming a polymerizable liquid crystal layer containing a polymerizable liquid crystal into which a dichroic pigment is mixed and an alignment film coming in contact with a portion of the polymerizable liquid crystal layer to align the polymerizable liquid crystal contained in the polymerizable liquid crystal layer with which the alignment film is in contact, and forms, in the polarization layer, a polarization portion in which the polymerizable liquid crystal layer and the alignment film of the polarization layer come into contact with each other in a display region and a black frame portion in which the polymerizable liquid crystal layer and the alignment film of the polarization layer do not come in contact with each other in a frame region surrounding the display region.

The disclosure is not limited to each of the embodiments described above, and various modifications may be made within the scope of the claims. Embodiments obtained by appropriately combining technical approaches disclosed in each of the different embodiments also fall within the technical scope of the disclosure. Moreover, novel technical features can be formed by combining the technical approaches disclosed in the embodiments.

The invention claimed is:

1. A display device comprising:
   from a lower layer,
   a TFT layer;
   a light-emitting layer;
   a sealing layer; and
   a polarization layer in this order,
   wherein the polarization layer includes a polymerizable liquid crystal layer containing a polymerizable liquid crystal into which a dichroic pigment is mixed, and an alignment film coming in contact with a portion of the polymerizable liquid crystal layer to align the polymerizable liquid crystal contained in the polymerizable liquid crystal layer with which the alignment film is in contact,
   in a display region, a region in which the polymerizable liquid crystal layer and the alignment film of the polarization layer come into contact with each other is a polarization portion, and
   in a frame region surrounding the display region, a region in which the polymerizable liquid crystal layer and the alignment film of the polarization layer do not come in contact with each other is a black frame portion.

2. The display device according to claim 1, further comprising:
   a cover material which is an upper layer of the polarization layer,
   wherein the polarization layer includes the alignment film between the polymerizable liquid crystal layer and the cover material.

3. The display device according to claim 1,
   wherein the polarization layer includes the alignment film between the sealing layer and the polymerizable liquid crystal layer.

4. The display device according to claim 1, further comprising:
   a $\lambda/4$ plate between the sealing layer and the polarization layer.

5. The display device according to claim 1, further comprising:
   a function film which is an upper layer or a lower layer of the polarization layer.

6. The display device according to claim 1,
   wherein a width of the black frame portion is not less than 3 mm and not greater than 15 mm.

7. The display device according to claim 1, further comprising:
   at an end portion of the display device, at least one of a notch portion with the black frame portion provided around the notch portion on the display region side and an opening positioned to be surrounded by the display region with the black frame portion provided around the opening on the frame region side.

8. A method for manufacturing a display device comprising:
   forming each layer of the display device including, from a lower layer, a TFT layer, a light-emitting layer, a sealing layer, and a polarization layer in this order,
   wherein the forming includes forming the polarization layer by forming a polymerizable liquid crystal layer containing a polymerizable liquid crystal into which a dichroic pigment is mixed and an alignment film coming in contact with a portion of the polymerizable liquid crystal layer to align the polymerizable liquid crystal contained in the polymerizable liquid crystal layer with which the alignment film is in contact, and
   in the polarization layer forming, a polarization portion in which the polymerizable liquid crystal layer and the alignment film of the polarization layer come into contact with each other in a display region and a black frame portion in which the polymerizable liquid crystal layer and the alignment film of the polarization layer do not come in contact with each other in a frame region surrounding the display region are formed in the polarization layer.

9. The method for manufacturing a display device according to claim 8,
wherein, in the polarization layer forming, the alignment film is formed using a printing method or an ink-jet method.

10. The method for manufacturing a display device according to claim 9,
wherein, in the polarization layer forming, the polymerizable liquid crystal layer is formed using a coating method.

11. The method for manufacturing a display device according to claim 8,
wherein the forming includes forming, at an end portion of the display device, at least one of a notch portion with the black frame portion provided around the notch portion on the display region side and an opening positioned to be surrounded by the display region with the black frame portion provided around the opening on the frame region side, and irradiating an alignment material at an end portion of at least one of the notch portion and the opening on the display region side to form the alignment film.

12. A display device manufacturing apparatus comprising:
a film formation device configured to form each layer of the display device including, from a lower layer, a TFT layer, a light-emitting layer, a sealing layer, and a polarization layer in this order,
wherein the film formation device is configured to form the polarization layer by forming a polymerizable liquid crystal layer containing a polymerizable liquid crystal into which a dichroic pigment is mixed and an alignment film coming in contact with a portion of the polymerizable liquid crystal layer to align the polymerizable liquid crystal contained in the polymerizable liquid crystal layer with which the alignment film is in contact, and to form, in the polarization layer, a polarization portion in which the polymerizable liquid crystal layer and the alignment film of the polarization layer come into contact with each other in a display region and a black frame portion in which the polymerizable liquid crystal layer and the alignment film of the polarization layer do not come in contact with each other in a frame region surrounding the display region.

* * * * *